United States Patent
Yamamura (10) Patent No.: US 7,126,840 B2
(45) Date of Patent: Oct. 24, 2006

(54) FERROELECTRIC MEMORY DEVICE AND ELECTRONIC APPARATUS

(75) Inventor: Mitsuhiro Yamamura, Suwa (JP)

(73) Assignee: Seiko Epson Corporation(JP)

( * ) Notice: Subject to any disclaimer, the term of this patent is extended or adjusted under 35 U.S.C. 154(b) by 0 days.

(21) Appl. No.: 10/979,084

(22) Filed: Oct. 29, 2004

(65) Prior Publication Data
US 2005/0122763 A1  Jun. 9, 2005

(30) Foreign Application Priority Data
Oct. 31, 2003  (JP) .............................. 2003-373353

(51) Int. Cl.
*G11C 5/06* (2006.01)
*G11C 11/22* (2006.01)
*G11C 11/4099* (2006.01)

(52) U.S. Cl. ........................................ 365/145; 365/65

(58) Field of Classification Search ................ 365/145, 365/210, 65
See application file for complete search history.

(56) References Cited

U.S. PATENT DOCUMENTS
2002/0063271 A1* 5/2002 Kim ........................... 257/295

FOREIGN PATENT DOCUMENTS
JP            04-042498          2/1992

* cited by examiner

*Primary Examiner*—Amir Zarabian
*Assistant Examiner*—Michael Weinberg
(74) *Attorney, Agent, or Firm*—Harness, Dickey & Pierce, P.L.C.

(57) ABSTRACT

A ferroelectric memory device that has a first bit line and a first plate line includes a first ferroelectric capacitor group having a plurality of ferroelectric capacitors coupled in series and in a ring shape. A switching means switches whether a ferroelectric capacitor out of the first ferroelectric capacitor group is electrically coupled to the first bit line and the first plate line.

11 Claims, 6 Drawing Sheets

FERROELECTRIC MEMORY DEVICE AND ELECTRONIC APPARATUS

RELATED APPLICATIONS

This application claims priority to Japanese Patent Application No. 2003-373353 filed Oct. 31, 2003 which is hereby expressly incorporated by reference herein in its entirety.

BACKGROUND

1. Field of the Invention

The present invention relates to a ferroelectric memory device and an electronic apparatus.

2. Related Art

A conventional ferroelectric memory is disclosed in Japanese Unexamined Patent Publication No. H4-42498 (Japanese Unexamined Patent Publication No. H4-42498).

However, in the conventional ferroelectric memory disclosed in Publication No. H4-42498, a predetermined voltage is applied to a ferroelectric capacitor in a non-selected memory cell which is coupled to the same plate line as that of a selected memory cell. There are cases when the predetermined voltage becomes as large as a fifth of the driving voltage depending on the junction capacitance of a cell transistor in the memory cell. Therefore, in the conventional ferroelectric memory, there is a problem that the polarized information recorded on the ferroelectric capacitor of the non-selected memory cell degrades gradually and may eventually be destroyed.

Therefore, the present invention is intended to provide a ferroelectric memory device and an electronic apparatus, which can solve the above described problem.

SUMMARY

In order to attain the above described objective, according to a first aspect of the present invention, a ferroelectric memory device is provided that has a first bit line and a first plate line, and a block comprising: a first ferroelectric capacitor group having a plurality of ferroelectric capacitors coupled in series and in a ring shape; and switching means which switches whether or not either ferroelectric capacitor out of the first ferroelectric capacitor group is electrically coupled to the first bit line and the first plate line.

According to such a configuration, a selected ferroelectric capacitor will be coupled to the remaining non-selected ferroelectric capacitor in parallel, with respect to the bit line and the plate line. Moreover, since the remaining non-selected ferroelectric capacitor is coupled mutually in series, the voltage applied to each non-selected ferroelectric capacitor becomes very small. That is, the electric field applied to the ferroelectric substance which constitutes the ferroelectric capacitor can be made very small, therefore the degradation of the ferroelectric capacitor can be suppressed.

Moreover, the capacitance of the ferroelectric capacitor coupled to the plate line at the time of a reading operation and/or a writing operation to the selected ferroelectric capacitor, is approximately equal to the capacitance of the selected ferroelectric capacitor. Therefore, the load of the plate line can be made very small and the ferroelectric memory device can be operated at a higher speed.

Moreover, according to such a configuration, since the voltage from the plate line is provided only to the selected ferroelectric capacitor, random access can be made to a predetermined ferroelectric capacitor. Accordingly, the unwanted charging and discharging of current can be reduced, therefore, a ferroelectric memory device with low power consumption can be provided.

In addition, the selected ferroelectric capacitor comprises the ferroelectric capacitor that is a target for the operation at the time of a reading operation or a writing operation of data, and the non-selected ferroelectric capacitor comprises the ferroelectric capacitor that is not a target for the operation at the time of a reading operation or a writing operation of data.

Moreover, it is preferable that the plurality of ferroelectric capacitors each have one end and another end, and the switching means comprises the block including: a first switch provided between the one end of the first ferroelectric capacitor out of the first ferroelectric capacitor group and the first bit line; a second switch provided between the one end of a second ferroelectric capacitor adjacent to the first ferroelectric capacitor and the other end of the first ferroelectric capacitor, and the first plate line; and a third switch provided between the other end of the second ferroelectric capacitor and the first bit line. It is preferable that the ferroelectric memory device further comprises the block including means for making the first switch and the second switch conductive when selecting the first ferroelectric capacitor, and making the second switch and the third switch conductive when selecting the second ferroelectric capacitor.

According to such a configuration, the number of ferroelectric capacitors and the number of switches in the ferroelectric capacitor array will be approximately the same. Namely, the number of switches relative to the number of ferroelectric capacitors will be approximately the same as that of a configuration of one transistor for one capacitor. Accordingly, the area of the ferroelectric capacitor array can be made small, and therefore, an inexpensive ferroelectric memory device can be provided while high integration of the ferroelectric memory device can be attained.

Moreover, it is preferable that the ferroelectric memory device further comprises a second bit line, wherein the switching means in the block switches whether or not either ferroelectric capacitor out of the first ferroelectric capacitor group is electrically coupled to the first bit line and the first plate line, or to the second bit line and the first plate line. Here, it is preferable that the switching means comprises a fourth switch which switches whether or not the one end of a third ferroelectric capacitor out of the first ferroelectric capacitor group is electrically coupled to the second bit line, and a fifth switch which switches whether or not the other end of the third ferroelectric capacitor and the first plate line are electrically coupled.

According to such a configuration, the load of the bit line can be reduced, while the ferroelectric capacitor coupled in series and in a ring shape can be easily constituted.

Moreover, it is preferable that the ferroelectric memory device comprises a plurality of the blocks, and each bit line and each plate line which constitute each block are arranged for each block independently i.e., respectively, and two ferroelectric capacitors coupled to the same plate line and to different bit lines in each block are simultaneously selected.

According to such a configuration, two ferroelectric capacitors per block are coupled to two bit lines, therefore, the data recorded on the two ferroelectric capacitors is made a complementary data, and thus stable operation can be realized with the two bit lines being the complementary bit lines.

Moreover, it is preferable that the ferroelectric memory device has a plurality of the blocks, and each one of the bit lines which constitute the adjoining block is shared, and the plate line is arranged for each block independently, and only one ferroelectric capacitor for each block is simultaneously selected.

According to such a configuration, two bit lines of the adjoining blocks are shared. Accordingly, the bit line can be easily controlled while the area of the ferroelectric capacitor array can be further reduced.

According to a second aspect of the present invention, a ferroelectric memory device is provided that has a bit line and a plate line, comprising: a plurality of ferroelectric capacitors coupled in series; a first dummy capacitor coupled in series to one end of the plurality of ferroelectric capacitors; a second dummy capacitor coupled in series to the other end of the plurality of ferroelectric capacitors; and a switching means, which switches whether or not either ferroelectric capacitor out of the plurality of ferroelectric capacitors is electrically coupled to the bit line and the plate line.

According to such a configuration, the selected ferroelectric capacitor will be coupled to the remaining non-selected ferroelectric capacitor and the dummy capacitor, in parallel, with respect to the bit line or the plate line. Accordingly, even at the end portion of the non-selected ferroelectric capacitor, the voltage applied to each non-selected ferroelectric capacitor will be very small like the ferroelectric memory device according to the first aspect. That is, the electric field applied to the ferroelectric substance which constitutes the ferroelectric capacitor can be made very small, and therefore, the degradation of the ferroelectric capacitor can be suppressed.

Moreover, in the ferroelectric memory devices, the dummy capacitor may be a plurality of ferroelectric capacitors coupled mutually in series.

According to such a configuration, the dummy capacitor can be made with exactly the same structure as the ferroelectric capacitor of the memory cell.

Moreover, it is preferable that the ferroelectric memory device further comprises a potential fixing portion which fixes the potential of the other end of the dummy capacitor whose one end is coupled to the plurality of ferroelectric capacitors.

According to such a configuration, by stabilizing the potentials of both ends of the dummy cell, the dummy cell can be prevented from being a noise source.

According to a third aspect of the present invention, a ferroelectric memory device is provided that has a first bit line and a first plate line, comprising: a first ferroelectric capacitor having one end and another end; a second ferroelectric capacitor having one end and another end, this one end being electrically coupled to the other end of the first ferroelectric capacitor; a first MOS transistor provided between the first bit line and the one end of the first ferroelectric capacitor so that either one of a source or a drain may be coupled only to the first bit line; a second MOS transistor provided between the first plate line, and the other end of the first ferroelectric capacitor and the one end of the second ferroelectric capacitor, so that either one of the source or the drain may be coupled only to the first plate line; and a third MOS transistor provided between the first bit line and the other end of the second ferroelectric capacitor, so that either one of the source or the drain may be coupled only to the first bit line.

According to a fourth aspect of the present invention, an electronic apparatus comprising the above described ferroelectric memory device is provided. Here, the electronic apparatus comprises a general apparatus having the memory device according to the present invention, which carries out a certain function, and the configuration thereof is not specifically limited, and includes equipment that needs RAM or ROM, such as a computer device in general, a cellular phone, PHS, PDA, an electronic notebook, and an IC card that have the above described memory device.

DETAILED DESCRIPTION

Hereinafter, with reference to the accompanying drawings, the present invention will be described through embodiments of the invention. However, the following embodiments do not limit the invention according to the claims, and all combinations of characteristics described in the embodiments are not necessarily indispensable for the realization of the invention.

Figure 1:
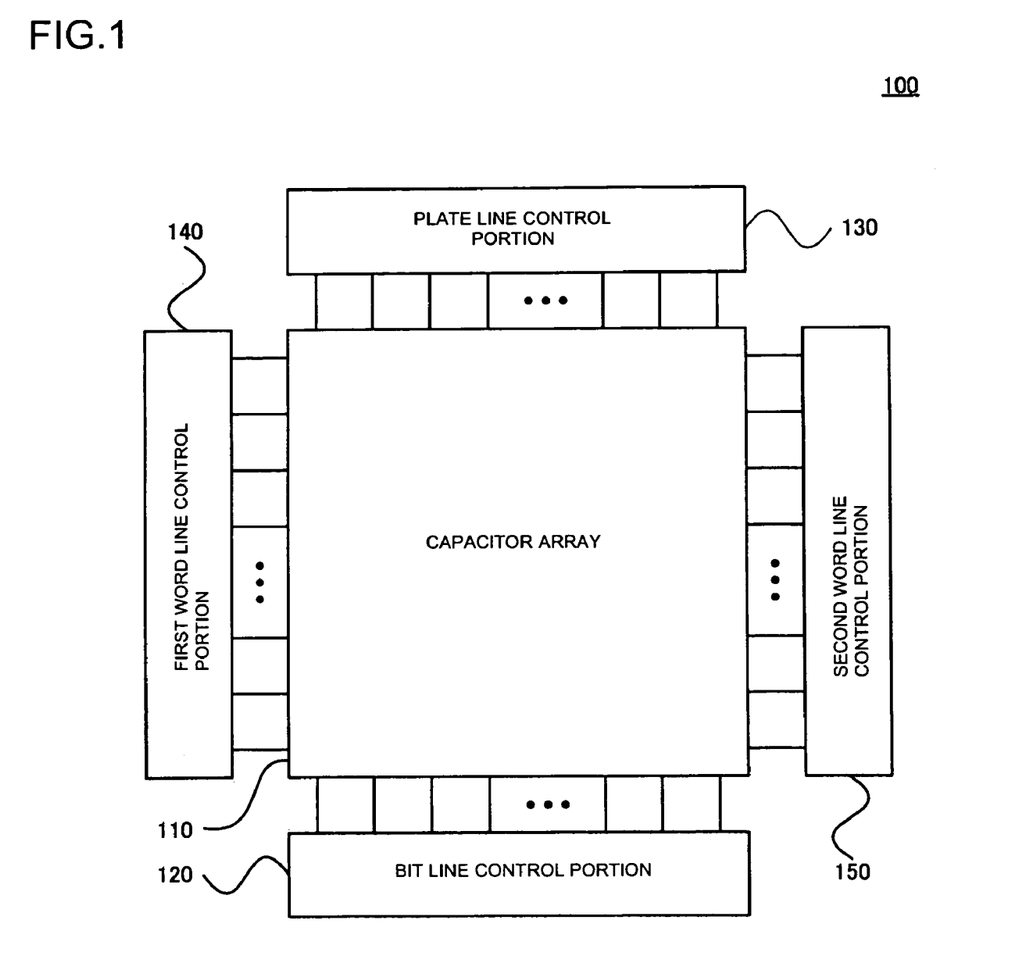
FIG. 1 is a block diagram showing a configuration of a ferroelectric memory device 100 according to one embodiment of the present invention.

FIG. 1 is a block diagram showing the configuration of a ferroelectric memory device 100 according to one embodiment of the present invention. The ferroelectric memory device 100 includes a ferroelectric capacitor array 110 in which a plurality of ferroelectric capacitors are provided in an array form, a bit line control portion 120, a plate line control portion 130, a first word line control portion 140, and a second word line control portion 150.

In this example, the bit line control portion 120 and the plate line control portion 130 are arranged to face each other, with the ferroelectric capacitor array 110 being interposed therebetween. Moreover, the first word line control portion 140 and the second word line control portion 150 are arranged to face each other, with the ferroelectric capacitor array 110 being interposed therebetween. Moreover, in the ferroelectric capacitor array 110, the bit line and the plate line are arranged mutually approximately in parallel, and the word line is arranged approximately perpendicular to the bit line and the plate line.

Figure 2:
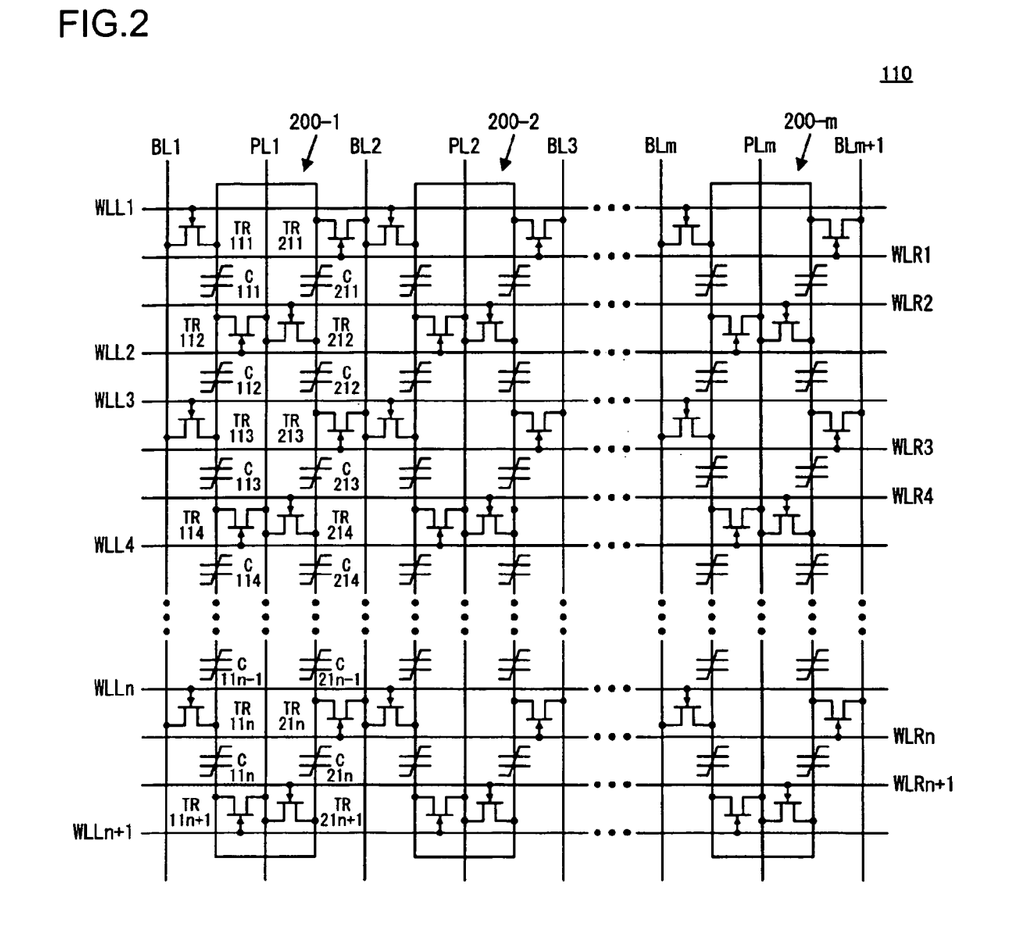
FIG. 2 is a view showing a first embodiment of a circuit configuration of the ferroelectric capacitor array 110.

FIG. 2 is a view showing the first embodiment of the circuit configuration of the ferroelectric capacitor array 110. The ferroelectric capacitor array 110 includes (2n+2) word lines of WLL1 through WLLn+1 and WLR1 through WLRn+1 (n is a positive integer), m ferroelectric capacitor groups of 200-1 through 200-m, which is one example of the ferroelectric capacitor group, and (m+1) bit lines of BL1 through BLm+1, and m plate lines of PL1 through PLm (m is a positive integer).

In this example, a j-th ferroelectric capacitor group 200-j (j is an integer of 1 to m) includes a plurality of ferroelectric capacitors C coupled in series and in a ring shape. Specifically, the ferroelectric capacitor group 200-j includes n ferroelectric capacitors Cjj1 through Cjjn controlled by a j-th bit line BLj and a j-th plate line PLj, and n ferroelectric capacitors C(j+1)j1 through C(j+1)j1n controlled by a j+1 bit line BLj+1 and a j-th plate line PLj. Then, the ferroelectric capacitor group 200-j coupled in series and in a ring shape includes the ferroelectric capacitor Cjj1 being coupled to the ferroelectric capacitor C(j+1)j1 in series, and the ferroelectric capacitor Cjjn being coupled to the ferroelectric capacitor C(j+1)jn in series.

Moreover, the ferroelectric capacitor array 110 includes a plurality of transistors TRjj1 through TRjj(n+1) which is one example of switches which switch whether or not a predetermined ferroelectric capacitor Cjjk constituting the ferroelectric capacitor group 200-j, and the bit line BLj and the plate line BLj are electrically coupled, and a plurality of transistors TR(j+1)j1 through TR(j+1)j(n+1) which switch whether or not C(j+1)jk, and the bit line BLj+1 and the plate line BLj are electrically coupled.

The transistors TRjj1 through TRjj(n+1) are provided to electrically couple one end of the ferroelectric capacitors Cjj1 through Cjjn to the bit line BLj, and the other end of the ferroelectric capacitor Cjj1 through Cjjn to the plate line PLj. Specifically, the transistors TRjj1 through TRjj(n+1) are provided so that a source or a drain may be coupled between and at both ends of the ferroelectric capacitors Cjj1 through Cjjn that are coupled in series, and the drain or the source may be alternately coupled to the bit line BLj or the plate line PLj.

That is, a transistor TRjjk is provided between one end of a ferroelectric capacitor Cjjk and the bit line BLj (or plate line PLj), and switches whether or not one end of the ferroelectric capacitor Cjjk and the bit line BLj (or plate line PLj) are electrically coupled. Moreover, a transistor TRjj(k+1) is provided between the other end of the ferroelectric capacitor Cjjk and the one end of the ferroelectric capacitor Cjj(k+1), and the plate line PLj (or bit line BLj), and switches whether or not the other end of the ferroelectric capacitor Cjjk and the one end of the ferroelectric capacitor Cjj(k+1), and the plate line PLj (or bit line BLj) are electrically coupled. Moreover, a transistor TRjj(k+2) is provided between the other end of a ferroelectric capacitor Cjj(k+1) and the one end of a ferroelectric capacitor Cjj(k+2), and the bit line BLj (or plate line PLj), and switches whether or not the other end of the ferroelectric capacitor Cjj(k+1) and the one end of the ferroelectric capacitor Cjj(k+2), and the bit line BLj (or plate line PLj) are electrically coupled.

The transistors TR(j+1)j1 through TR(j+1)j(n+1) are provided so as to electrically couple the one end of the ferroelectric capacitors C(j+1)j1 through C(j+1)jn to the bit line BLj+1, and also the other end of the ferroelectric capacitors C(j+1)j1 through C(j+1)jn to the plate line PLj, like the transistors TRjj 1 through TRjj(n+1).

In this example, in the ferroelectric capacitor group 200-j constituted in a ring shape, two transistors, TRjj1 and TR(j+1)j1, are provided between the one end of a plurality of ferroelectric capacitors Cjj1 through Cjjn which are coupled to the bit line BLj and mutually coupled in-series, and one end of a plurality of the ferroelectric capacitors C(j+1)j1 through C(j+1)jn which are coupled to the bit line BLj+1 and mutually coupled in-series, however, only one transistor TR may be provided, in other example. In the same way, two transistors, TRjj(n+1) and TR(j+1)j(n+1), are provided between these other ends, however, a configuration of only one transistor may work. That is, the transistor TR of the same number as that of the ferroelectric capacitor C which constitutes the ferroelectric capacitor group 200-j, may be coupled to the ferroelectric capacitor group 200-j.

In this example, the ferroelectric memory device 100 has the first word line control portion 140 and the second word line control portion 150. Word lines WLL1 through WLLn+1 and word lines WLR1 through WLRn+1 are electrically coupled to the gate of a predetermined transistor TR, respectively. Then, the first word line control portion 140 controls the word lines WLL1 through WLLn+1, and the second word line control portion 150 controls the word lines WLR1 through WLRn+1. That is, the first word line control portion 140 and the second word line control portion 150 control whether or not the one end or the other end of ferroelectric capacitors C111 through C(m+1)mn are electrically coupled to bit lines BL1 through BLm+1 or the plate lines PL1 through PLm.

The word lines WLL1 through WLLn+1 are coupled to the gate of the transistor TR coupled to the ferroelectric capacitors Cjj1 through Cjjn, which are controlled by the bit line BLj and the plate line PLj, out of a plurality of ferroelectric capacitors which constitute the ferroelectric capacitor group 200-j. Moreover, the word lines WLR1 through WLRn+1 are coupled to the gate of the transistor TR which controls the ferroelectric capacitors C(j+1)1 through C(j+1)n that are controlled by the bit line BLj+1 and the plate line PLj.

In this example, two bit lines BLj and BLj+1 and one plate line PLj are provided to one ferroelectric capacitor group 200-j. Moreover, the bit lines BL2 through BLm out of the bit lines BL1 through BLm+1 are shared by a plurality of ferroelectric capacitor groups, respectively. That is, the bit lines BL2 through BLm are capable of supplying voltage to the ferroelectric capacitor which constitute a predetermined ferroelectric capacitor group, and another ferroelectric capacitor group adjoining the ferroelectric capacitor group.

It is desirable that the bit lines BL1 through BLm+1 and the plate lines PL1 through PLm are arranged mutually in parallel. Moreover, it is desirable that the word lines WLL1 through WLLn+1 and WLR1 through WLRn+1 are arranged approximately perpendicular to the bit lines BL1 through BLm+1 and the plate lines PL1 through PLm.

Figure 3:
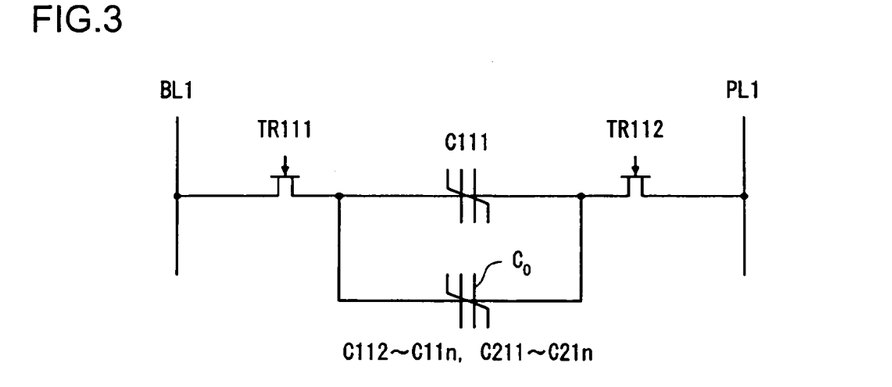
FIG. 3 is a view showing an equivalent circuit in the case of carrying out a reading operation and a writing operation to C111.

FIG. 3 is a view showing an equivalent circuit in the case of carrying out a reading operation and a writing operation to the ferroelectric capacitor C111. In this example, a first ferroelectric capacitor group 200-1 is constituted by ferroelectric capacitors C111 through C11n and C211 through C21n that are coupled in series and in a ring shape. Among these, the remaining ferroelectric capacitors C111 through C11n and C211 through C21n coupled in series after having taken out the ferroelectric capacitor C111, are made equivalent to one ferroelectric capacitor C0. At this time, the ferroelectric capacitor C111 has a configuration being coupled in parallel with the ferroelectric capacitor C0, to the first bit line BL1 and the first plate line PL1.

Next, with reference to FIG. 1 through FIG. 3, one example of an operation of the ferroelectric capacitor array 110 according to this example will be described. Hereinafter, as an example, a reading operation which reads the data written in the ferroelectric capacitor C111 that is included in the first ferroelectric capacitor group 200-1, and a (re-) writing operation which writes data in the ferroelectric capacitor C111 will be described.

When reading the data written in the ferroelectric capacitor C111, first of all, the bit line control portion 120 and the plate line control portion 130 pre-charge the first bit line BL1 and the first plate line PL1 to 0V, respectively. Next, by charging the potential of the word lines WLL1 and WLL2 to a potential of VCC or more by the first word line control portion 140, the transistors TR111 and 112 are made conductive. Accordingly, the one end and the other end of the ferroelectric capacitor C111 are pre-charged to 0V, respectively. Moreover, in accordance with the one end and the other end of the ferroelectric capacitor C111 being charged to 0V, both ends of the ferroelectric capacitor C0 are also charged to 0V Next, after the bit line control portion 120 makes the first bit line BL1 being in a floating condition, the plate line control portion 130 changes the potential of the first plate line PL1 from 0V to VCC. Accordingly, the potential difference of both ends of the ferroelectric capacitor C111 changes from 0V to VCC, therefore, the potential of the first bit line BL1 increases i.e., changes based on the data written in the ferroelectric capacitor C111. That is, the increased amount i.e., the change amount of the potential of the first bit line BL1 in case that the data written in the ferroelectric capacitor C111 is "1", is larger than the increased amount of the potential of the first bit line BL1 in case that the data is "0".

The bit line control portion 120 judges whether the data written in the ferroelectric capacitor C111 is "1" or "0" based on the increased amount of the potential of the first bit line BL1. In this case, it is desirable that the bit line control portion 120 amplifies the increased amount to judge the data. The configuration of the bit line control portion 120 will be described later in FIG. 6.

Here, when the potential difference of both ends of the ferroelectric capacitor C111 changes from 0V to a maximum of VCC, the potential difference of both ends of the ferroelectric capacitor C0 also changes from 0V to the maximum of VCC. However, the ferroelectric capacitor C112 through 11n and C21n through 211 are coupled in series, therefore, when the capacitance of each of the ferroelectric capacitors is approximately equal, the potential difference of VCC/(2n−1) at its maximum just arises at both ends of each of the ferroelectric capacitors, and if n is large, it can be assumed that a potential difference is hardly produced in the ferroelectric capacitors C112 through 11n and C21n through 211.

Of course, as described above, since the potential of the bit line BL1 increases more than 0V, the potential difference of both ends of the ferroelectric capacitor C0 will be smaller than VCC. Moreover, when the potential difference of both ends of each ferroelectric capacitor is small, the capacitance of each ferroelectric capacitor is approximately equal, regardless of the data written in each ferroelectric capacitor being "1" or "0".

Here, assuming the capacitance of the above described each ferroelectric capacitor is Cf, the capacitance of the ferroelectric capacitor C0 will be Cf/(2n−1), which is extremely small. For this reason, the dielectric capacitor C0 hardly affects the above described reading operation. In the same way, the capacitance of the dielectric capacitor C0 can also be almost neglected as the load capacitance of the bit line BL1 and the plate line PL1. Accordingly, C0 will not be a contributing factor which delays the potential changes of the bit line BL1 and the plate line PL1, and thus a high-speed reading operation can be realized.

Next, the same data as the data read by a reading operation is written in the ferroelectric capacitor C111 by changing the potential of the first plate line PL1 from VCC to 0V. Also in this case, there is produced a potential difference of 0V or VCC at both ends of the ferroelectric capacitor C111 corresponding to the data to write in, however, there is produced just a potential difference of 0V or VCC/(2n−1) at both ends of the remaining ferroelectric capacitors C112 through 11n and C21n through 211. Accordingly, data writing can be carried out without destroying the data written in the remaining ferroelectric capacitors C112 through 11n and C21n through 211. Moreover, since the capacitance of C0 is small, a high-speed re-writing operation can be realized like the reading operation.

Moreover, according to this example, in the predetermined ring-shaped ferroelectric capacitor group 200-j, even if selecting any one of the ferroelectric capacitor Cjjk, the number of remaining ferroelectric capacitors of the ring-shaped ferroelectric capacitor group 200-j is 2n-1 pieces, therefore, stable reading and writing operations can be realized, without depending on the position of the selected ferroelectric capacitor.

Figure 4:
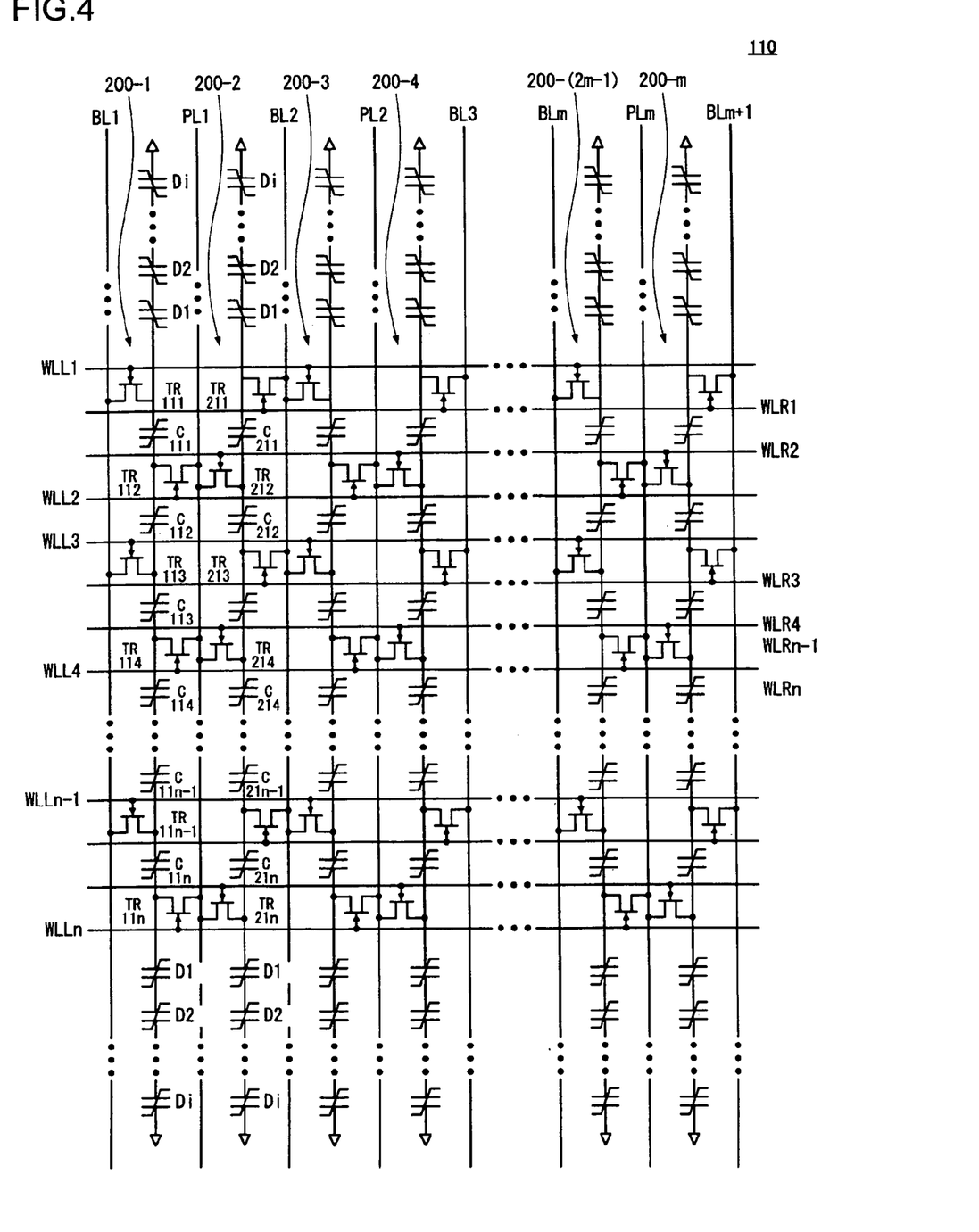
FIG. 4 is a view showing a second embodiment of the circuit configuration of the ferroelectric capacitor array 110.

FIG. 4 is a view showing a second embodiment of the circuit configuration of the ferroelectric capacitor array 110. Hereinafter, the ferroelectric capacitor array 110 of the second embodiment will be described focusing on points that are different from the first embodiment. In addition, elements with the same numeral as that of the first embodiment have the same function as that of the first embodiment.

The ferroelectric capacitor array 110 of this example has 2m ferroelectric capacitor groups 200-1 through 200-2m comprising a plurality of ferroelectric capacitors Cjj1 through Cjjn and C(j+1)j1 through C(j+1)jn coupled in series which have one end and another end. The one end and the other end of the ferroelectric capacitor groups 200-1 through 200-2m are electrically coupled to a j-th bit line BLj, a j+1 bit line BLj+1, or a j-th plate line PLj through the transistor TR, respectively. Moreover, provision is made to constitute a ferroelectric capacitor group 200-(2j−1) to be controlled by the j-th bit line BLj and the j-th plate line PLj, and a ferroelectric capacitor group 200-2j is controlled by the j+1 bit line BLj+1 and the j-th plate line PLj.

Moreover, the ferroelectric capacitor array 110 of this example has i dummy ferroelectric capacitors (i is an integer of 2 or more) D1 through Di coupled in series to the ferroelectric capacitors Cjj1 through Cjjn, or C(j+1)j1 through C(j+1)jn, with respect to the ferroelectric capacitor groups 200-1 through 200-2m, respectively. The dummy ferroelectric capacitor D is provided at both ends of the ferroelectric capacitors Cjj1 through Cjjn, and C(j+1)j1 through C(j+1)jn, respectively.

As for the dummy ferroelectric capacitors D1 through Di coupled in series, one end thereof is coupled to the ferroelectric capacitor group and th other end thereof is controlled to a desired voltage. For example, the other end is fixed to 0V.

Figure 5:
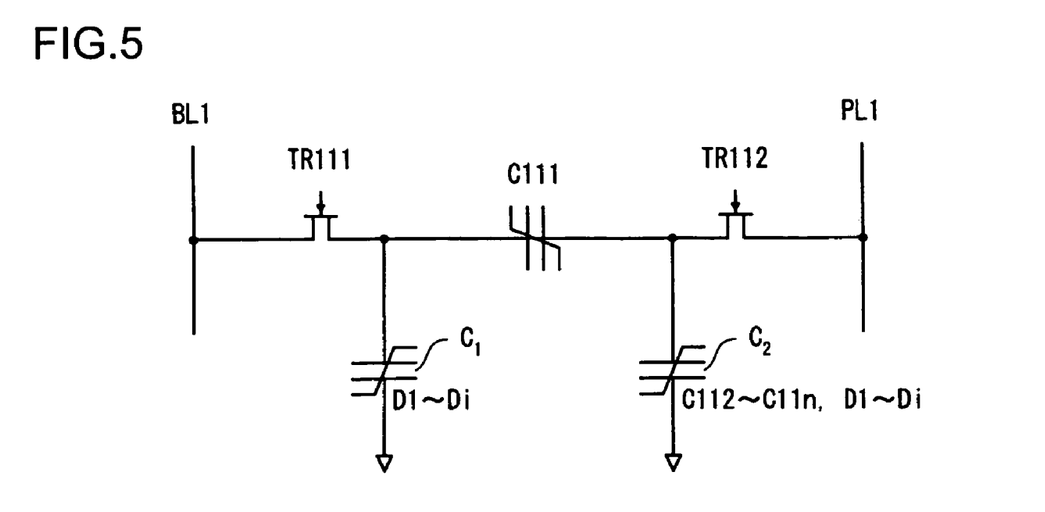
FIG. 5 is a view showing an equivalent circuit in the case of carrying out a reading operation and a writing operation to C111.

FIG. 5 is a view showing an equivalent circuit in the case of carrying out a reading operation and a writing operation to C111. In this example, the first ferroelectric capacitor group 200-1 is constituted by the ferroelectric capacitors C111 through C11n coupled in series and the dummy ferroelectric capacitors D1 through Di coupled to both ends thereof. Among these, the dummy ferroelectric capacitors D1 through Di coupled in series, which exist at one side when taking out the ferroelectric capacitor C111, are made C1, and the remaining ferroelectric capacitors C112 through C11n and the dummy ferroelectric capacitors D1 through Di which exist at the opposite side are made C2. At this time, the ferroelectric capacitors C111 and C1 are coupled in parallel through the transistor TR111 from the bit line BL1, and the ferroelectric capacitors C111 and C2 are coupled in parallel through a transistor TR112 from the plate line PL1.

Here, if the number i of the dummy ferroelectric capacitors is a sufficiently large number, the capacitance values of C1 and C2 will be small like C0 in the first embodiment, therefore, C1 and C2 will not affect the reading and writing operations. At this time, the voltage applied to each of the ferroelectric capacitors which constitute C1 and C2 will be small like the first embodiment, therefore, even if the ferroelectric capacitors which store data in C1 and C2 are included, the data will not be destroyed.

In this example, the dummy capacitors are assumed to be a plurality of ferroelectric capacitors coupled in series, however, as long as two objectives that the capacitance values of C1 and C2 are made small, and that the voltage applied to each ferroelectric capacitor included in C1 and C2 is made small may be attained, the dummy capacitor may be, for example, one or more paraelectric capacitors coupled in series. If the dummy capacitors are a plurality of ferroelectric capacitors coupled in series, they can be formed with the same structure as the main part of the memory cell ferroelectric capacitor. On the other hand, if the dummy capacitor is the paraelectric capacitors, the occupation area of the dummy capacitor can be remarkably reduced.

In the same way, in terms of attaining the above described objective, the one end of the dummy capacitor that is fixed to 0V, in this example, may be in an open condition. If the one end of the dummy capacitor is fixed to 0V, a stable operation can be expected, because noises generated in the dummy capacitor are absorbed by the 0V potential wiring. On the other hand, if the one end of the dummy capacitor is in an open condition, the voltage applied to each ferroelectric capacitor included in C1 and C2 can be further reduced, and the data destruction of the non-selected ferroelectric capacitor can be prevented more strongly.

Figure 6A:
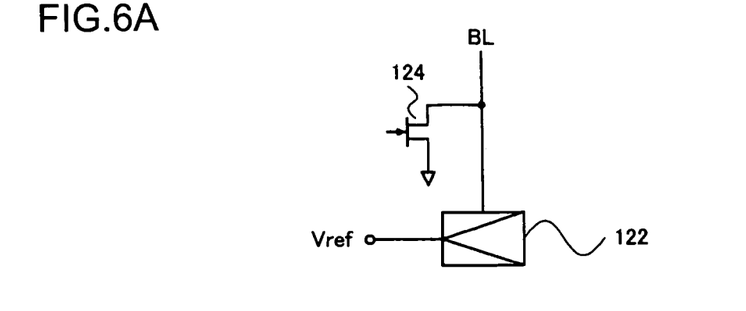
FIGS. 6a–6c are views showing one example of the configuration of a bit line control portion 120.

FIG. 6 is a view showing one example of the configuration of the bit line control portion 120. In an example shown in FIG. 6a, the bit line control portion 120 includes, for each of the bit lines BL1 through BLm+1, a transistor 124 coupled to a power supply that pre-charges the potential of the bit line to a predetermined potential, and a sense amplifier 122 which judges the potential of the bit line. A reference voltage Vref for judging whether the data written in the selected ferroelectric capacitor is "0" or "1" is provided to the sense amplifier 122, and the sense amplifier 122 judges the data written in the ferroelectric capacitor by comparing the potential of the bit line with the reference voltage Vref.

Figure 6B:
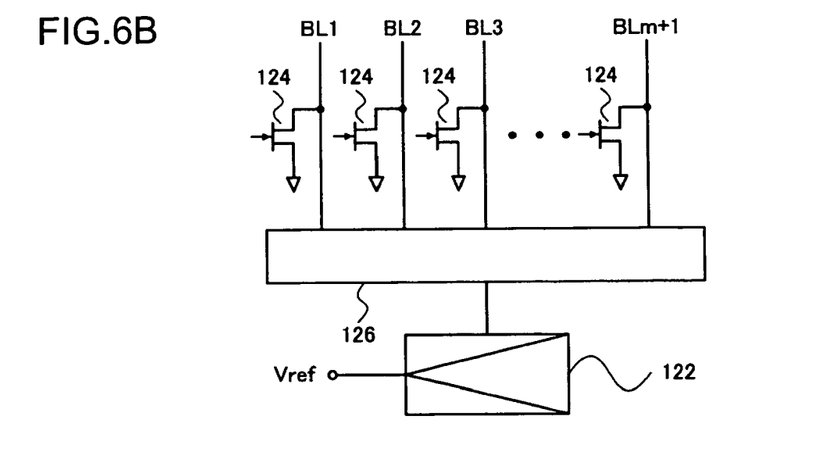

In an example shown in FIG. 6b, the bit line control portion 120 is capable of coupling a plurality of bit lines BL to one sense amplifier 122. Specifically, the bit line control portion 120 includes the sense amplifier 122 and means 126 for electrically coupling either of the plurality of bit lines BL to the sense amplifier 122. The bit line control portion 120 may be capable of coupling all the bit lines BL included in the ferroelectric capacitor array 110 to the sense amplifier 122, and may have a plurality of sense amplifiers 122. According to this example, because a plurality of bit lines BL are capable of coupling to one sense amplifier 122, the occupation area of the sense amplifier 122 in the ferroelectric memory device 100 can be made extremely small. Moreover, because the occupation area of the sense amplifier 122 can be made small, a large-scale and highly sensitive sense amplifier can be provided.

Figure 6C:
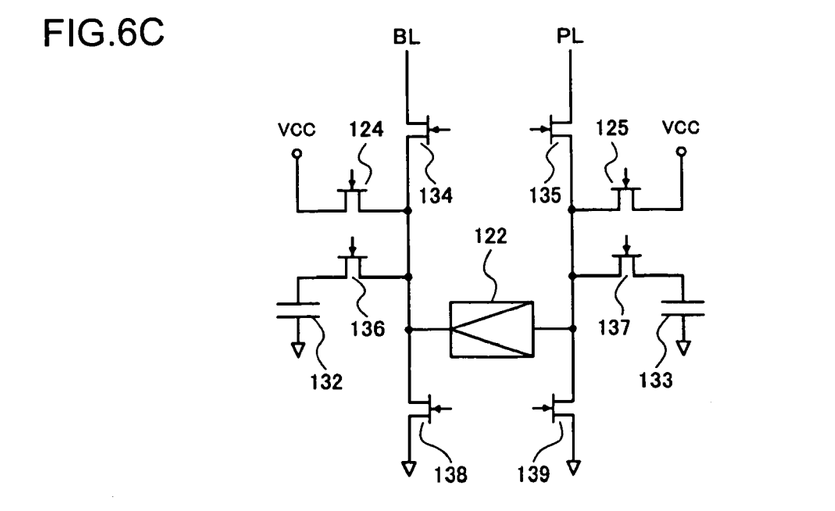

In an example shown in FIG. 6c, the bit line control portion 120 judges the data written in the ferroelectric capacitor that is controlled by the plate line PL and the bit line BL, based on both potentials of the bit line BL and the plate line PL. Specifically, in this example, both the bit line BL and the plate line PL are electrically coupled to the bit line control portion 120, and the bit line control portion 120 includes: the sense amplifier 122; a plurality of transistors 124 and 125 coupled to the power supply that charges the bit line BL and the plate line PL to a predetermined potential, respectively; a plurality of transistors 134 and 135 which switch whether or not the bit line BL and/or the plate line PL, and the sense amplifier 122 are electrically coupled; a first capacitor 132 which accumulates electric charges based on the potential of the bit line BL; a second capacitor 133 which accumulates electric charges based on the potential of the plate line PL; a plurality of transistors 136 and 137 which switch whether or not the bit line BL and the first capacitor 132, and the plate line PL and the second capacitor 133 are electrically coupled, respectively, and transistors 138 and 139 which switch whether or not the potential of the bit line BL and/or the plate line PL is set to a predetermined potential, such as a ground potential.

Next, an operation that the bit line control portion 120 shown in FIG. 6 reads the data written in the ferroelectric capacitor C will be described. First of all, the potential of both the bit line BL and the plate line PL is set to 0V by making the transistors 124 and 125, and 136 and 137 non-conductive, and making the transistors 134, 135, 138, and 139 conductive. Next, after making the transistors 138 and 139 non-conductive, and making the transistor 137 conductive, the potential of the bit line BL is set to VCC by making the transistor 124 conductive. Accordingly, the potential of the plate line PL increases based on the data written in the ferroelectric capacitor C that is electrically coupled to the bit line BL and the plate line PL. Then, electric charges are accumulated in the second capacitor 133 based on the increased amount.

In addition, if the data being written in the ferroelectric capacitor C is "1" data, this first reading operation will be a destructive reading, and, "0" data is going to be written in the ferroelectric capacitor C at the same time as the reading operation. However, by the amount that the potential of the plate line PL increases, the writing potential to the ferroelectric capacitor C decreases, consequently the data between "0" data and "1" data is written in the ferroelectric capacitor C. If the data being written in the ferroelectric capacitor C is "0" data, it will be a nondestructive reading, therefore, the data being written in the ferroelectric capacitor C will not change.

Next, the potential of the bit line BL and the plate line PL is set to 0V by making the transistors 124 and 137 non-conductive, and making the transistors 138 and 139 conductive. Then, after making the transistors 138 and 139 non-conductive, and making the transistor 136 conductive, the potential of the plate line PL is set to VCC by making the transistor 125 conductive. Accordingly, the potential of the bit line BL increases based on the data written in the ferroelectric capacitor C. Then, based on the increased amount, electric charges are accumulated in the first capacitor 132.

In this second-time reading operation, since the reading direction is reversed against the first reading operation, electric charges corresponding to "1" data is read from the ferroelectric capacitor C from which "0" data was read in the first reading operation. On the other hand, because the data between "0" data and "1" data is written in the ferroelectric capacitor C from which "1" data was read in the first reading operation, even if the reading direction is reversed, the data between "0" data and "1" data is read.

Then, the sense amplifier 122 judges the data being written in the ferroelectric capacitor C by comparing the electric charge amount accumulated in the first capacitor 132 with the electric charge amount accumulated in the second capacitor 133.

Figure 7:
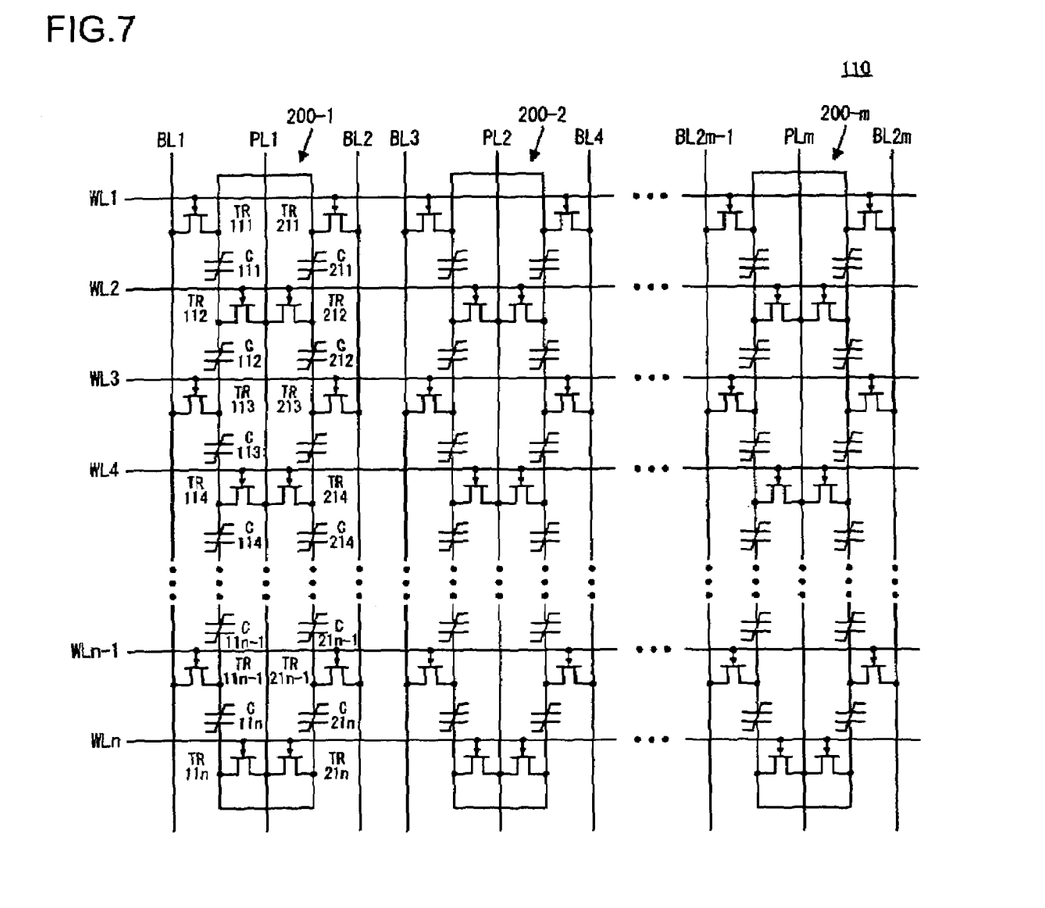
FIG. 7 is a view showing a third embodiment of the circuit configuration of the ferroelectric capacitor array 110.

FIG. 7 is a view showing a third embodiment of the circuit configuration of the ferroelectric capacitor array 110. Hereinafter, the ferroelectric capacitor array 110 of the third embodiment will be described focusing on points that are different from the first embodiment and the second embodiment. In addition, elements with the same numeral as that of the first embodiment and/or second embodiment have the same function as that of the other embodiments.

The ferroelectric capacitor array 110 includes a ferroelectric capacitor group 200-1 through 200-m which have a plurality of ferroelectric capacitors C coupled in series and in a ring shape, m plate lines PL1 through PLm, 2m bit lines BL1 through BL2m, and n word lines WL1 through WLn. In this example, one plate line PLj, and two bit lines BL2j-1 and BL2j are provided for one ferroelectric capacitor group 200-j. That is, in the ferroelectric capacitor array 110 of this example, the bit lines BL2j-1 and BL2j are not shared by a plurality of the ferroelectric capacitor groups 200-1 to 200-m.

Moreover, in this example, in the ferroelectric capacitor group 200-j, a ferroelectric capacitor C(j+1)jk is provided corresponding to a ferroelectric capacitor Cjjk, and if a predetermined data is being stored in the ferroelectric capacitor Cjjk, data opposite to the predetermined data is stored in the ferroelectric capacitor C(j+1)jk. That is, the ferroelectric capacitor array 110 has the configuration of two transistors for two capacitors.

Specifically, a transistor TRjjk is provided between one end of the ferroelectric capacitor Cjjk and a bit line BL2j-1, and a transistor TR(j+1)jk is provided between one end of the ferroelectric capacitor C(j+1)jk and a bit line BL2j. Furthermore, a transistor TRjj(k+1) is provided between the other end of the ferroelectric capacitor Cjjk and the plate line PLj, and a transistor TR(j+1)j(k+1) is provided between the other end of the ferroelectric capacitor C(j+1)jk and the plate line PLj.

Moreover, a word line WLk is electrically coupled to the gate of a transistor TRjjk and a transistor TR(j+1)jk. That is, if a potential of VCC or more is provided to the word line WLk, both the transistor TRjjk and the transistor TR(j+1)jk are conducted, therefore, the one end of the ferroelectric capacitor Cjjk and the one end of the ferroelectric capacitor C(j+1)jk are electrically coupled to the bit line BL2j-1 and the bit line BL2j, respectively.

Moreover, a word line WLk+1 is electrically coupled to the gate of the transistor TRjj(k+1) and the transistor TR(j+1)j(k+1). That is, if a potential VCC or more is provided to the word line WL(k+1), both the transistor TRjj(k+1) and the transistor TR(j+1)j(k+1) are conducted, therefore, the other end of the ferroelectric capacitor Cjjk and the other end of the ferroelectric capacitor C(j+1)jk are electrically coupled to the plate line PLj.

Then, if VCC is provided to a predetermined plate line PLj at the time of a reading operation, the potential of the bit line BL2j-1 changes corresponding to the data which the ferroelectric capacitor Cjjk stores, and the potential of the bit line 2j changes corresponding to the data which the ferroelectric capacitor C(j+1)jk stores. Then, the bit line control portion 120 can judge the data stored in the ferroelectric capacitor Cjjk and the ferroelectric capacitor C(j+1)jk by comparing the potential of the bit line BL2j-1 with the potential of the bit line BL2j. As described above, in this example, because complementary data can be used in storing and reading data, stability in the operation can be drastically improved.

The practical examples and application examples described through the above described embodiments of the present invention can be used by suitable combination depending on purpose, or adding changes or improvements, and the present invention is not limited to the description of the above described embodiments. It is apparent from the description that embodiments which add such a combination, changes, or improvement can be included in the scope of the present invention.

What is claimed is:

1. A ferroelectric memory device that has a first bit line and a first plate line, comprising:
  a first ferroelectric capacitor group having a plurality of ferroelectric capacitors coupled in series and in a ring shape; and
  a switching means that switches whether a ferroelectric capacitor out of the first ferroelectric capacitor group is electrically coupled to the first bit line and the first plate line.

2. The ferroelectric memory device according to claim 1, wherein the plurality of ferroelectric capacitors each have one end and another end, and the switching means comprises:
  a first switch provided between the one end of the first ferroelectric capacitor out of the first ferroelectric capacitor group and the first bit line;
  a second switch provided between the one end of a second ferroelectric capacitor adjacent to the first ferroelectric capacitor and the other end of the first ferroelectric capacitor, and the first plate line; and
  a third switch provided between the other end of the second ferroelectric capacitor and the first bit line.

3. The ferroelectric memory device according to claim 2, further comprising means for making the first switch and the second switch conductive when selecting the first ferroelectric capacitor, and making the second switch and the third switch conductive when selecting the second ferroelectric capacitor.

4. The ferroelectric memory device according to claim 2, further comprising a second bit line, wherein the switching means switches whether the ferroelectric capacitor out of the first ferroelectric capacitor group is electrically coupled to one of:
  the first bit line and the first plate line; and
  the second bit line and the first plate line.

5. The ferroelectric memory device according to claim 4, wherein the switching means comprises:
  a fourth switch that switches whether one end of a third ferroelectric capacitor out of the first ferroelectric capacitor group and the second bit line are electrically coupled; and
  a fifth switch that switches whether another end of the third ferroelectric capacitor and the first plate line are electrically coupled.

6. The ferroelectric memory device according to claim 4, comprising a plurality of blocks comprising the ferroelectric capacitor group and the switching means, wherein the first bit line and the second bit line, and the first plate line are arranged for each block.

7. The ferroelectric memory device according to claim 4, comprising a plurality of blocks including the ferroelectric capacitor group and the switching means, wherein at least one of the first bit line and second bit line is shared by a plurality of adjoining blocks, and the first plate line is arranged for each block.

8. A ferroelectric memory device, comprising:
  a ferroelectric capacitor group having a plurality of ferroelectric capacitors coupled in series and in a ring shape; and a bit line and a plate line that are electrically coupled to the ferroelectric capacitor group; and switching means for switching whether one of the plurality of ferroelectric capacitors is electrically coupled to the bit line and the plate line, wherein the bit line and the plate line are arranged for each ferroelectric capacitor group.

9. A ferroelectric memory device, comprising:

a ferroelectric capacitor group having a plurality of ferroelectric capacitors coupled in series and in a ring shape;

a bit line and a plate line that are electrically coupled to the ferroelectric capacitor group; and switching means for switching whether one of the plurality of ferroelectric capacitors is electrically coupled to the bit line and the plate line, wherein the bit line is shared by a plurality of adjoining ferroelectric capacitor groups, and the plate line is arranged for each ferroelectric capacitor group.

10. An electronic apparatus comprising the ferroelectric memory device according to claim 1.

11. A memory device that communicates with a bit line and a plate line, comprising:

a plurality of ferroelectric capacitors that is coupled in series and in a ring shape;

a first switch that determines whether at least one of the plurality of ferroelectric capacitors is electrically coupled to the bit line; and a second switch that determines whether the at least one of the plurality of ferroelectric capacitors is electrically coupled to the plate line.

* * * * *